United States Patent
Dean et al.

(10) Patent No.: US 6,788,550 B1
(45) Date of Patent: Sep. 7, 2004

(54) CIRCUIT CARD RETENTION DEVICE

(75) Inventors: Ronald Paul Dean, Fort Collins, CO (US); Kristina L Mann, Fort Collins, CO (US); Clint E. Conrady, Fort Colllins, CO (US); James Bullington, Athens, AL (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 10/427,789

(22) Filed: Apr. 30, 2003

(51) Int. Cl.⁷ ............................. H05K 7/14; H05K 7/18
(52) U.S. Cl. ..................... 361/801; 361/683; 361/737; 361/755; 211/41.17
(58) Field of Search ................................ 361/801, 737, 361/796, 755, 740, 754, 683, 753; 211/41.17

(56) References Cited

U.S. PATENT DOCUMENTS

| | | |
|---|---|---|
| 5,563,450 A | 10/1996 | Bader et al. |
| 5,601,349 A | 2/1997 | Holt |
| RE36,695 E | 5/2000 | Holt |
| 6,069,796 A * | 5/2000 | Hastings et al. ............ 361/754 |
| 6,138,839 A * | 10/2000 | Cranston, III et al. ... 211/41.17 |
| 6,147,872 A | 11/2000 | Roy |
| 6,160,717 A | 12/2000 | Desousa et al. |
| 6,215,673 B1 | 4/2001 | Gordon et al. |
| 6,231,139 B1 | 5/2001 | Chen |
| 6,246,585 B1 | 6/2001 | Gunther et al. |
| 6,269,007 B1 | 7/2001 | Pongracz et al. |
| 6,287,138 B1 | 9/2001 | Kuang |
| 6,312,275 B1 | 11/2001 | Tortorella |
| 6,320,752 B1 | 11/2001 | Jang |
| 6,373,713 B1 | 4/2002 | Jensen et al. |
| 6,381,149 B1 | 4/2002 | Megason et al. |
| 6,522,556 B2 | 2/2003 | Boe |
| 2003/0012007 A1 | 1/2003 | Vier et al. |

* cited by examiner

*Primary Examiner*—David Martin
*Assistant Examiner*—Hung S. Bui
(74) *Attorney, Agent, or Firm*—Kevin M. Hart

(57) ABSTRACT

A circuit card retention device includes a longitudinal retention bar hinge-mounted to a support member of a computer enclosure or chassis. First and second hand-releasable lock members are attached to the retention bar at either end. Each lock member includes a flexible stop. When the retention bar is in a retaining position, the flexible stops engage a substantially rigid surface of the enclosure or chassis, keeping the bar in the retaining position. The flexible stops may be disengaged from the rigid surface by application of finger pressure, allowing the retention bar to pivot from the retaining position to an open position.

3 Claims, 8 Drawing Sheets

Fig. 11

CIRCUIT CARD RETENTION DEVICE

FIELD OF THE INVENTION

This invention relates generally to the field of securing circuit cards within a computer chassis or enclosure.

BACKGROUND

Most modern computer enclosures contain a plurality of circuit cards. For example, personal computers include a number of input/output circuit cards ("i/o cards"). Each i/o card typically includes a socket for interfacing with the plug of an input/output device such as a video monitor, network cable or printer. I/o cards such as these need to be mounted within the computer enclosure in such a way that the sockets of the cards are accessible through openings formed in a wall of the enclosure. Other types of circuit cards not needing an interface with the outside of the enclosure may be mounted entirely on the inside of the enclosure. In either case, the cards need to be retained during operation and released during maintenance or replacement.

SUMMARY OF THE INVENTION

A circuit card retention device according to a preferred embodiment of the invention includes a longitudinal retention bar hinge-mounted to a support member of a computer enclosure or chassis. First and second hand-releasable lock members are attached to the retention bar at either end. Each lock member includes a flexible stop. When the retention bar is in a retaining position, the flexible stops engage a substantially rigid surface of the enclosure or chassis, keeping the bar in the retaining position. The flexible stops may be disengaged from the rigid surface by application of finger pressure, allowing the retention bar to pivot from the retaining position to an open position.

DETAILED DESCRIPTION OF THE PREFERRED EMBODIMENTS

Figure 1:
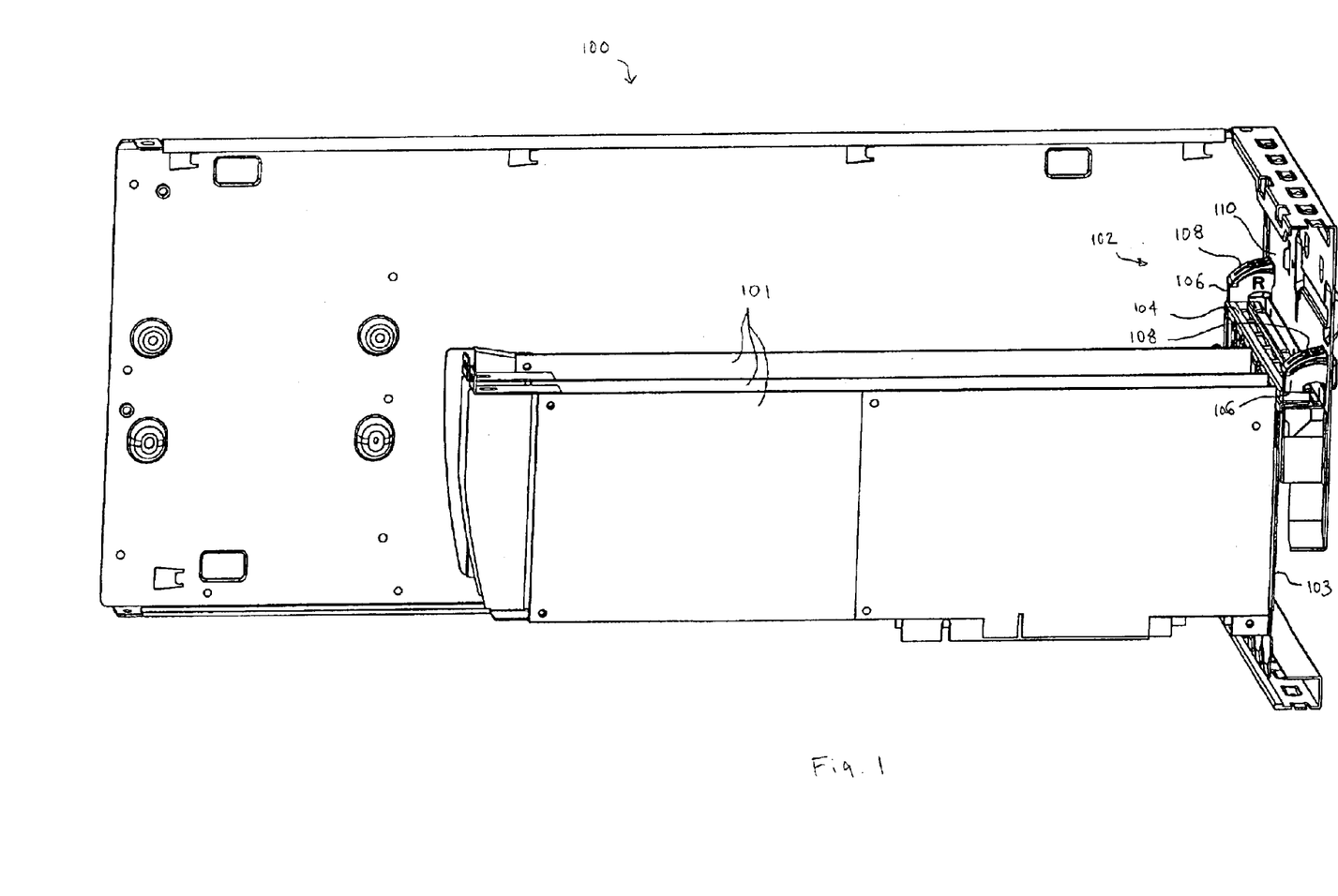
FIG. 1 is an oblique view of a computer enclosure or chassis containing a circuit card retention device according to a preferred embodiment of the invention. The retention device is shown in a retaining position.
Figure 2:
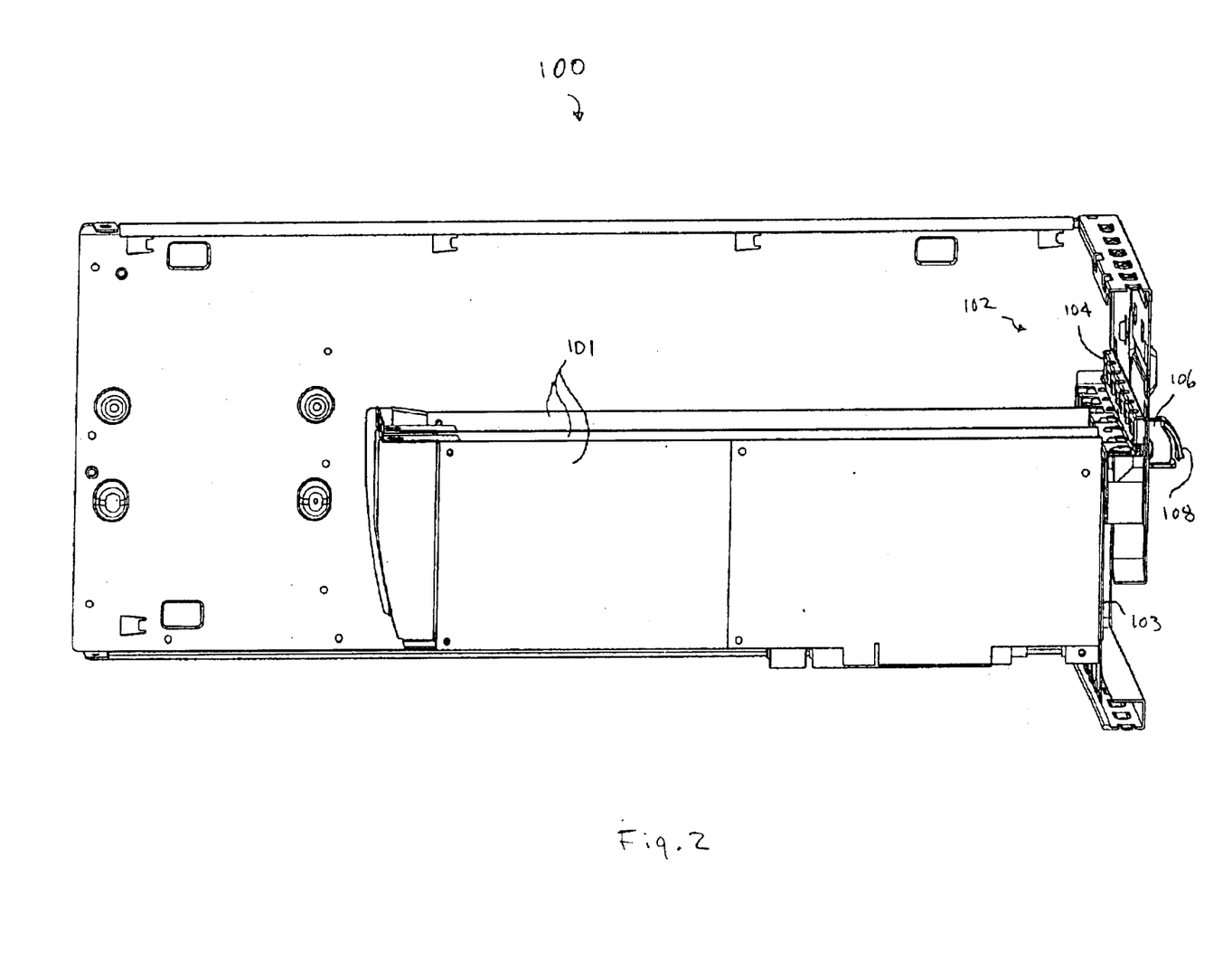
FIG. 2 is an oblique view of the computer enclosure or chassis of FIG. 1. The retention device is shown in an open position.
Figure 3:
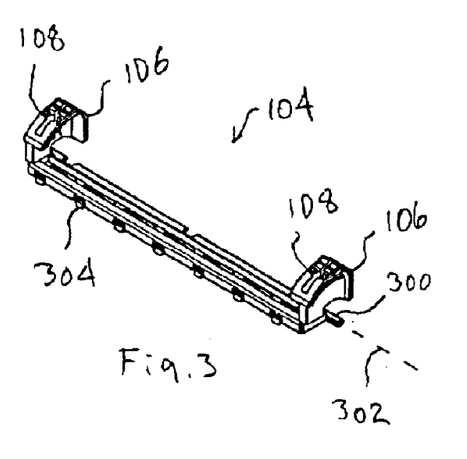
FIGS. 3 and 4 are front and rear oblique views of the retention bar and stops of FIG. 1.
Figure 4:
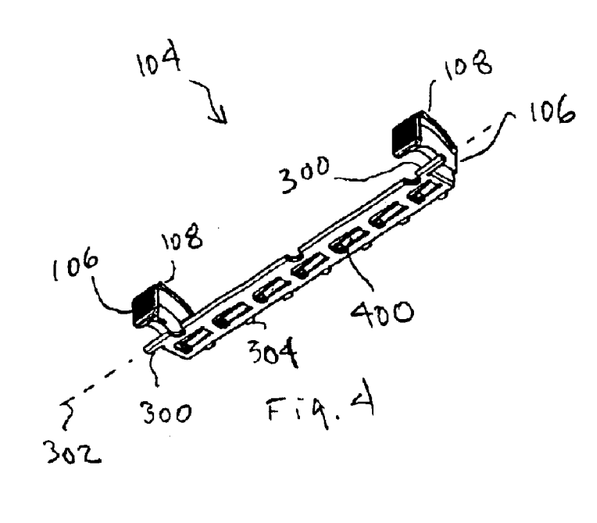
Figure 10:
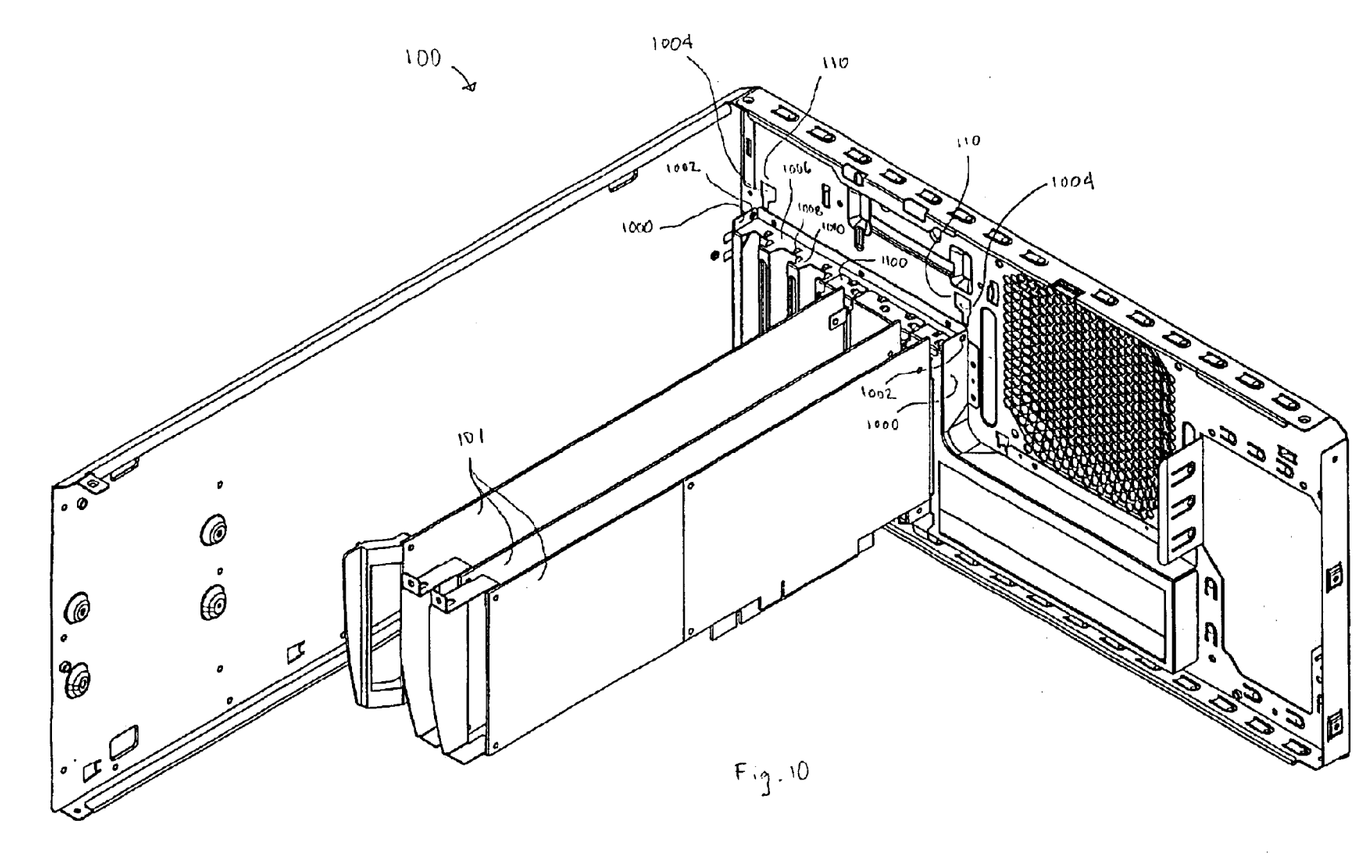
FIG. 10 is an oblique view of the computer enclosure or chassis of FIG. 1 shown with the circuit card retention device removed.

FIGS. 1 and 2 illustrate a computer enclosure or chassis 100 containing plural circuit card assemblies 101 and a circuit card retention device 102 according to a preferred embodiment of the invention. Circuit card retention device 102 includes a longitudinal retention bar 104 hinge-mounted to a support member 1000 of enclosure or chassis 100. The hinge mount may be accomplished by a variety of means such that bar 104 may pivot around an axis 302 parallel with its longitudinal dimension. In the embodiment shown, the hinge mount is accomplished by inserting end protrusions 300 of bar 104 through holes 1002 provided in support member 1000. (For clarity, FIGS. 1 and 2 illustrate enclosure or chassis 100 with retention device 102 present but with support member 1000 removed. FIG. 10 illustrates enclosure or chassis 100 with support member 1000 present but with retention device 102 removed.)

Figure 5:
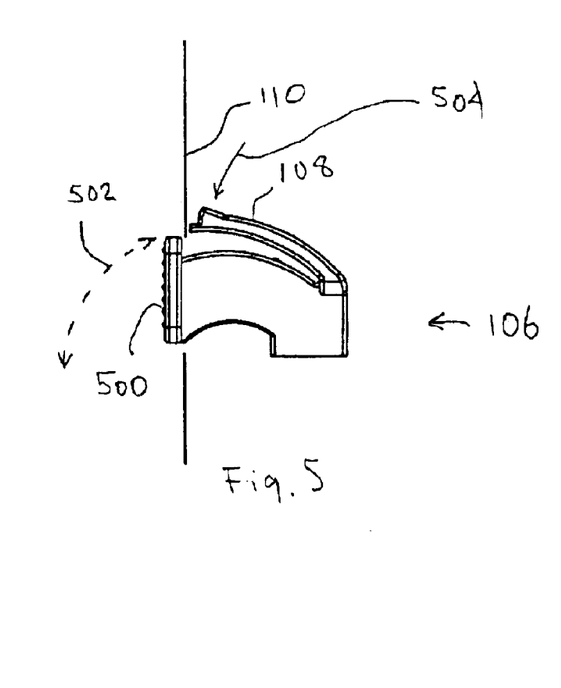
FIGS. 5 and 6 are side and oblique views of one of the stops of FIG. 1.
Figure 6:
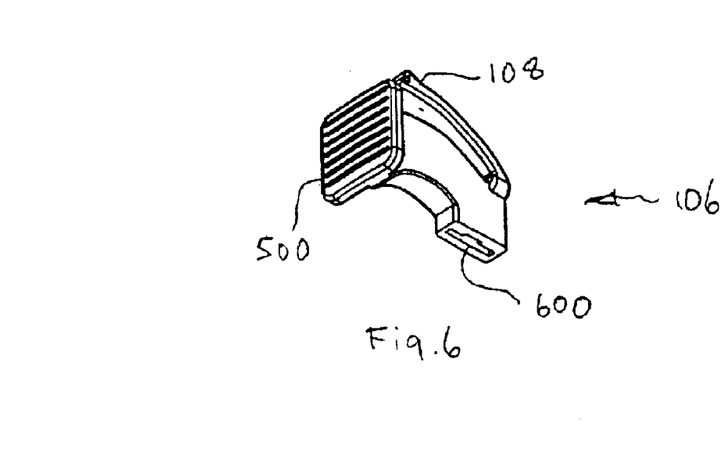
Figure 7:
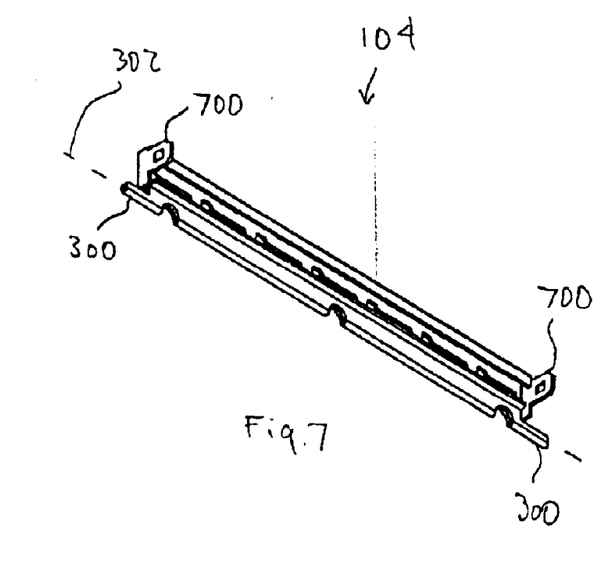
FIGS. 7 and 8 are oblique views of the retention bar of FIG. 1.
Figure 8:
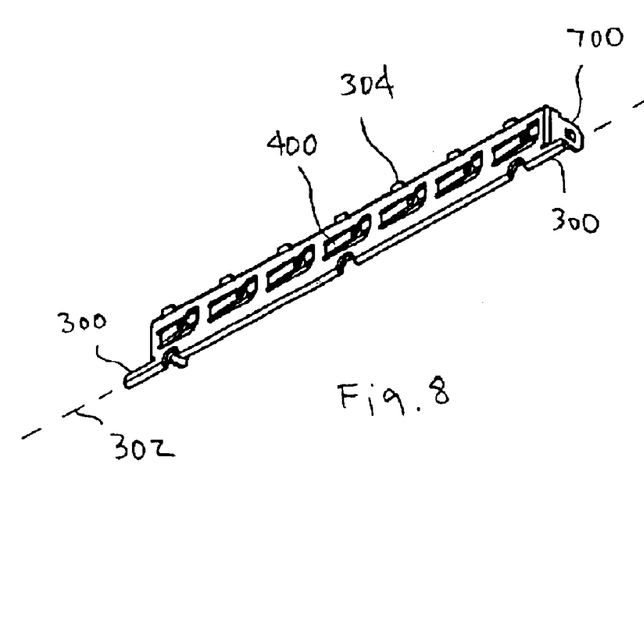

A hand-releasable lock member 106 is attached to bar 104 at either end. The attachment of lock members 106 to bar 104 may be accomplished by a variety of means. In the embodiment shown, the attachment is accomplished by engaging tabs 107 formed on bar 104 with corresponding slots 600 formed in lock members 106. Each lock member 106 includes a flexible stop 108. FIG. 5 illustrates stop 108 in its rest position. By application of a force 504, stop 108 may be flexed away from its rest position toward the body of lock member 106. Preferably, stop 108 is designed so that a finger-applied force is sufficient to flex it away from its rest position. When force 504 is released, stop 108 returns to its rest position. Although any suitable material may be used to form lock members 106, in one embodiment molded plastic was used.

A substantially rigid surface 10 is provided on enclosure or chassis 100. Surface 100 should be disposed so that it interrupts an arcuate excursion path 502 of stop 108. Surface 100 should also be disposed so that, when stop 108 is flexed away from its rest position, stop 108 will clear surface 100 so that it can rotate around excursion path 502. Although various means may be employed for accomplishing this, in the embodiment shown it is accomplished by providing clearance holes 1004 in surface 110 for lock clearing lock members 106 as they rotate. In the retaining position illustrated in FIG. 1, stops 108 are engaged with surface 110 at the tops of holes 1004. In the open position shown in FIG. 2, stops 108 have cleared surface 110 and have been rotated through holes 1004. Excursion path 502 should be long enough to allow bar 104 to clear circuit cards 101 so that they can be removed from enclosure or chassis 100. In the embodiment shown, excursion path 502 is approximately 90 degrees.

Figure 9:
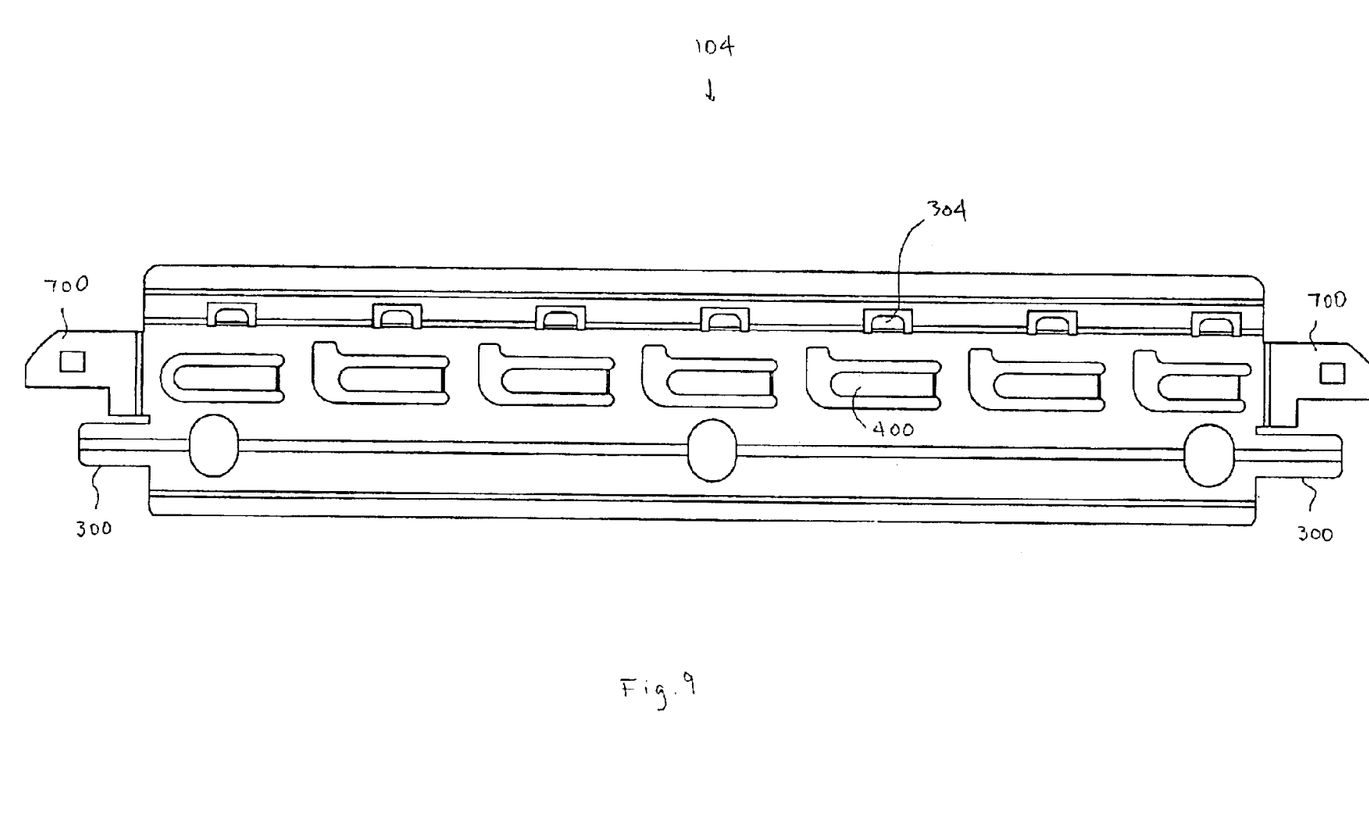
FIG. 9 is a plan view showing the retention bar of FIG. 1 prior to folding it into the shape shown in the other figures.

Bar 104 should be long enough to extend across and engage plural circuit card assemblies 101 (as shown in FIG. 1) when bar 104 is in the retaining position. In the embodiment shown, bar 104 engages the tops 1100 of circuit card mounting flanges 103. In other embodiments, bar 104 may engage a different member of circuit card assemblies 101, or may engage the circuit cards themselves. Flexible fingers 400 may optionally be provided along the bottom of bar 104 to exert a spring force against the tops of circuit card assemblies 101 when bar 104 is in the retaining position, thereby helping to hold the card assemblies down in their sockets. Protrusions 304 may also be provided along the length of bar 104 as shown. Protrusions 304 help to retain mounting flanges 103 against mounting surface 1006 when bar 104 is in the retaining position. Although any suitable material may be used to form bar 104, in one embodiment bar 104 was fashioned from die-cut sheet metal. An unfolded version is illustrated in FIG. 9.

Figure 11:
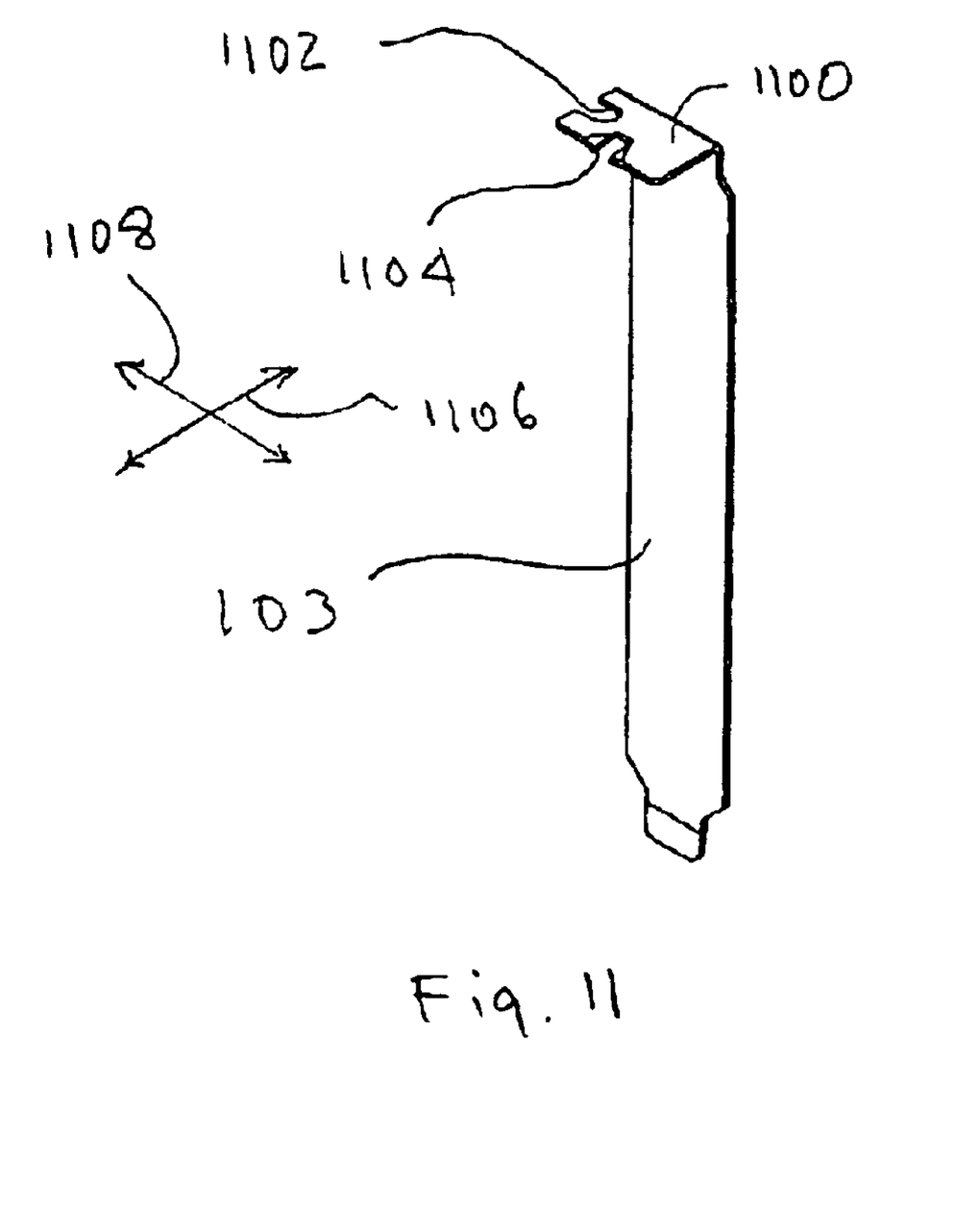
FIG. 11 is an oblique view of a circuit card mounting flange having positioning features according to a preferred embodiment of the invention.

Surface 100 may be an exterior wall of enclosure or chassis 100 or may be interior to enclosure or chassis 100 depending on the application. In either case, alignment of circuit card assemblies 101 may be enhanced by adding protrusions 1008 and 1010 (see FIG. 10) to mounting surface 1006 and corresponding slots 1102 and 1104 to the tops 1100 of mounting flanges 103. Protrusion 1008 and slot 1102 serve to prevent circuit card assembly 101 from moving in dimension 1106. Protrusion 1010 and slot 1104 serve to prevent circuit card assembly 101 from moving in dimension 1108.

While the invention has been described in detail with reference to preferred embodiments thereof, the described embodiments have been presented by way of example and not by way of limitation. It will be understood by those skilled in the art that various changes may be made in the form and details of the described embodiments without deviating from the spirit and scope of the invention as defined by the appended claims.

What is claimed is:

1. A circuit card retention device, comprising:
   a longitudinal retention bar hinge-mounted to a support member of a computer enclosure or chassis;
   first and second hand-releasable lock members attached to the bar at either end, each lock member having an arcuate top surface and a flexible stop having an arcuate bottom surface, the top and bottom surfaces having substantially the same radius such that the top and bottom surfaces contact one another when the stop is flexed from a rest position to a depressed position; and
   a substantially rigid surface of the enclosure or chassis disposed to interrupt an arcuate excursion path of the stop and also disposed such that the stop clears the substantially rigid surface when the stop is in the depressed position.

2. The circuit card retention device of claim 1, wherein:
   the bar is sufficiently long to extend across and engage plural circuit card assemblies when the bar is in a retaining position.

3. The circuit card retention device of claim 2, wherein:
   the arcuate excursion path of the stops is sufficiently long to allow the bar to clear the plural circuit card assemblies when the bar is in an open position.

* * * * *